(12) United States Patent
Kemerer et al.

(10) Patent No.: US 8,384,140 B2
(45) Date of Patent: Feb. 26, 2013

(54) STRUCTURE FOR DUAL CONTACT TRENCH CAPACITOR AND STRUCTURE THEREOF

(75) Inventors: Timothy W. Kemerer, Essex Junction, VT (US); Jenifer E. Lary, Hinesburg, VT (US); James S. Nakos, Essex Junction, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 12/181,341

(22) Filed: Jul. 29, 2008

(65) Prior Publication Data
US 2010/0025813 A1   Feb. 4, 2010

(51) Int. Cl.
*H01L 27/108* (2006.01)
(52) U.S. Cl. . 257/302; 257/301; 257/303; 257/E27.092; 257/E29.346; 257/E21.396
(58) Field of Classification Search .................. 257/301, 257/302, 303, E27.092, E29.346, E21.396
See application file for complete search history.

(56) References Cited

U.S. PATENT DOCUMENTS

| | | | |
|---|---|---|---|
| 4,645,564 A | | 2/1987 | Morie et al. |
| 4,918,502 A | * | 4/1990 | Kaga et al. ............... 257/304 |
| 5,275,974 A | * | 1/1994 | Ellul et al. ................ 438/386 |
| 6,236,079 B1 | * | 5/2001 | Nitayama et al. ......... 257/306 |
| 6,259,149 B1 | | 7/2001 | Burkhardt et al. |
| 6,455,369 B1 | | 9/2002 | Forster et al. |
| 6,750,096 B2 | | 6/2004 | Steck et al. |
| 6,954,921 B2 | * | 10/2005 | Hassibi et al. ............ 716/103 |
| 6,972,451 B2 | | 12/2005 | Delpech et al. |
| 7,344,953 B2 | | 3/2008 | Hecht et al. |
| 7,554,148 B2 | | 6/2009 | Su et al. |
| 2004/0232557 A1 | * | 11/2004 | Kim ........................... 257/758 |
| 2005/0110114 A1 | | 5/2005 | Lu et al. |
| 2006/0134877 A1 | | 6/2006 | Goebel et al. |
| 2006/0194348 A1 | | 8/2006 | Araujo et al. |
| 2007/0058458 A1 | | 3/2007 | Pan |
| 2007/0059879 A1 | | 3/2007 | Ting |
| 2007/0148899 A1 | * | 6/2007 | Kim ........................... 438/396 |
| 2008/0048232 A1 | | 2/2008 | Su et al. |
| 2008/0291601 A1 | | 11/2008 | Roozeboom et al. |

OTHER PUBLICATIONS

Office Action for corresponding U.S. Appl. No. 12/181,343.
Office Action for corresponding U.S. Appl. No. 12/181,335.
Office Action for corresponding U.S. Appl. No. 12/181,338.
Final Office Action dated Jan. 27, 2011 for corresponding U.S. Appl. No. 12/181,343.
Notice of Allowance dated Oct. 25, 2010, in U.S. Appl. No. 12/181,335.
Final Office Action dated Jun. 18, 2010, in U.S. Appl. No. 12/181,335.
Non-Final Office Action dated Aug. 18, 2010, in U.S. Appl. No. 12/181,343.
Final Office Action dated Jan. 29, 2010, in U.S. Appl. No. 12/181,343.

* cited by examiner

*Primary Examiner* — Julio J Maldonado
*Assistant Examiner* — Amar Movva
(74) *Attorney, Agent, or Firm* — Anthony Canale; Roberts Mlotkowski Safran & Cole, P.C.

(57) ABSTRACT

A dual contact trench capacitor and design structure for a dual contact trench capacitor is provided. The structure includes a first plate extending from a trench and isolated from a wafer body, and a second plate extending from the trench and isolated from the wafer body and the first plate.

23 Claims, 10 Drawing Sheets

STRUCTURE FOR DUAL CONTACT TRENCH CAPACITOR AND STRUCTURE THEREOF

CROSS-REFERENCE TO RELATED APPLICATIONS

This application is related to U.S. Ser. Nos. 12/181338, 12/181343 and 12/181335 respective and filed on the same day and currently pending.

FIELD OF THE INVENTION

The present invention generally relates to a design structure, and more particularly, to a dual contact trench capacitor and design structure for a dual contact trench capacitor.

BACKGROUND OF THE INVENTION

Capacitors are used to store charge in integrated circuits (ICs) such as in DRAM and SRAM cells. However, the growing demand for increasingly smaller and thus more cost effective semiconductor devices, e.g., with large memory capacities, has pushed the development of miniaturized structures in sub-micron technologies. But such miniaturization has its limits. For example, the size of the capacitor becomes increasingly larger with regard to the circuit itself, thus taking up considerable chip real estate. Also, in certain applications, the capacitor can become easily disrupted due to radiation or other unwanted external charging events.

By way of example, for certain radiation hardened applications the use of a dual capacitor dual, resistor feedback has been used. These structures, though, take up a considerable amount of real estate and have not been found to be very robust to radiation events, for example. Other applications include a single capacitor and two resistor configuration which is believed to be more robust to exposure to high radiation environments such as space applications. However, this approach places additional requirements on the properties of the capacitor. In particular, both electrodes cannot be contacting any part of the silicon, either diffusion or substrate. If they are a radiation event will upset the SRAM cell, regardless of where the electrons hit the cell. For example, in a radiation environment, electron hole pairs (e.g., carriers of electric charge) will be swept to a voltage potential which, in turn, will disrupt the state of the capacitor.

Also, it is known to use MIMs in radiation and other environments. However, as technology nodes have advanced the capacitance values attainable at practical sizes have not been able to scale with the circuit requirements.

Accordingly, there exists a need in the art to overcome the deficiencies and limitations described hereinabove.

SUMMARY

In a first aspect of the invention, a structure comprises a first plate within a trench and isolated from a wafer body by a first insulator layer formed in the trench, and a second plate within the trench and isolated from the wafer body and the first plate by a second insulator layer formed in the trench.

In an additional aspect of the invention, a structure comprises: a shallow trench isolation (STI) structure in a wafer body; a hole through the STI and extending into the wafer body; a first plate within the hole isolated from the wafer body; and a second plate within the hole which is independent of the first plate, the second plate being isolated from the first plate.

In a further aspect of the invention, a design structure for a dual trench capacitor is embodied in a machine readable medium for designing, manufacturing, or testing an integrated circuit. The design structure comprises: a first plate within a trench and isolated from a wafer body by a first insulator layer formed in the trench; and a second plate within the trench and isolated from the wafer body and the first plate by a second insulator layer formed in the trench.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to a trench capacitor and a design structure for a dual contact trench capacitor. By implementing the invention, it is now possible to prevent radiation or other unwanted charging events from disrupting the capacitor. This is possible by providing isolated contacts or electrode plates in a dual contact trench capacitor arrangement. Also, the present invention provides more capacitance using conventional dielectrics than known MIM (Metal Insulator Metal) structures thus allowing a more extendable approach. Also, the contact trench capacitor arrangement of the present invention is scalable and easily tunable with future generation devices.

Structure and Fabrication Processes

Figure 1:
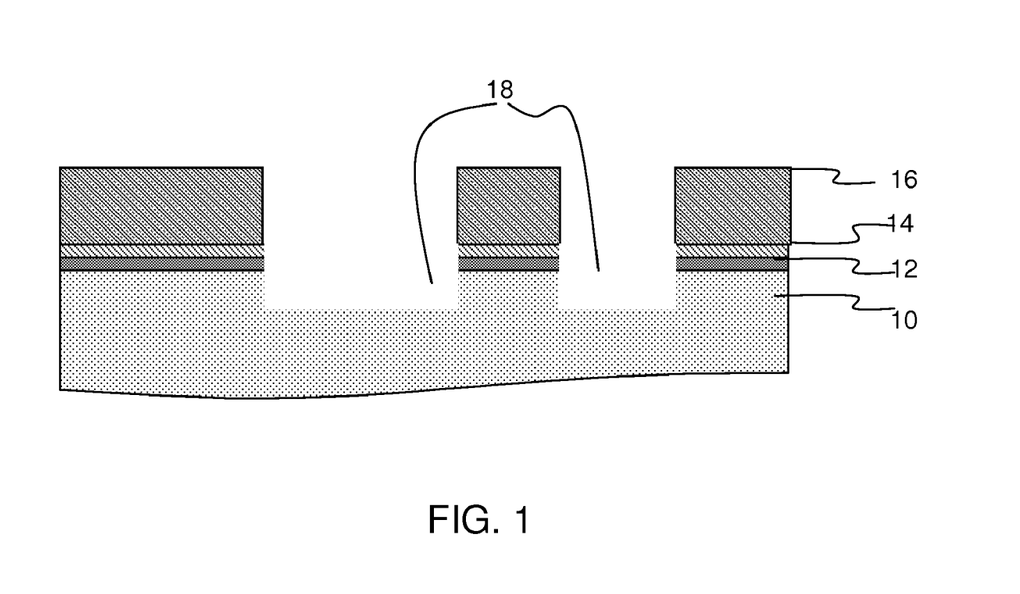
FIG. 1 represents a beginning structure and processes for fabricating the structure in accordance with an aspect of the invention.

FIG. 1 represents a beginning structure and processes for fabricating the structure in accordance with the invention. More specifically, FIG. 1 shows a silicon dioxide ($SiO_2$) layer 12 formed on a conventional substrate 10 such as silicon (e.g., wafer body). The Si wafer 10, in embodiments, may be a P type, N type or an epi wafer, depending on the particular application. In embodiments, the $SiO_2$ layer 12 is deposited on the substrate 10 in a conventional deposition process. The $SiO_2$ layer 12 can range in thickness depending on its application. More specifically, in one illustrative non-limiting example, the $SiO_2$ layer 12 can range in thickness from about 50 Å to 1000 Å and is preferably about 200 Å.

A pad layer 14, e.g., Silicon Nitride (SiN) layer, is deposited on the $SiO_2$ layer 12 in a conventional deposition process. The SiN layer 14 is preferably $Si_3N_4$ with a thickness of about 1000 Å to 1200 Å; although, other thicknesses are also contemplated by the invention. A resist 16 is selectively patterned on the layer 14 to form trenches 18 in a conventional manner such as, for example, exposing the resist 16 to a light source.

For example, a mask material (not shown) may be deposited over the resist 16 at selective portions. Once the mask is formed, using conventional photolithographic processes, a hole can be opened to expose portions of the pad layer 14.

Still referring to FIG. 1, exposed portions of the pad layer 14 as well as the SiO$_2$ layer 12 and substrate 10 are etched using a conventional reactive ion etching (RIE) process to form trenches 18. More specifically, using conventional etching processes such as, for example, Reactive Ion Etching (RIE), trenches are formed in the layers 10, 12, 14. Although not shown, the RIE will also etch away the resist 16. In embodiments, the trenches will be about 2000 Å to 5000 Å deep from the surface of the substrate 10. The trenches 18, though, can be of many different depths, depending on the capacitance targets. For example, the trenches 18 can extend entirely through the substrate 10 in order to provide higher capacitance due to an increased surface area of subsequently formed plates.

Figure 2:
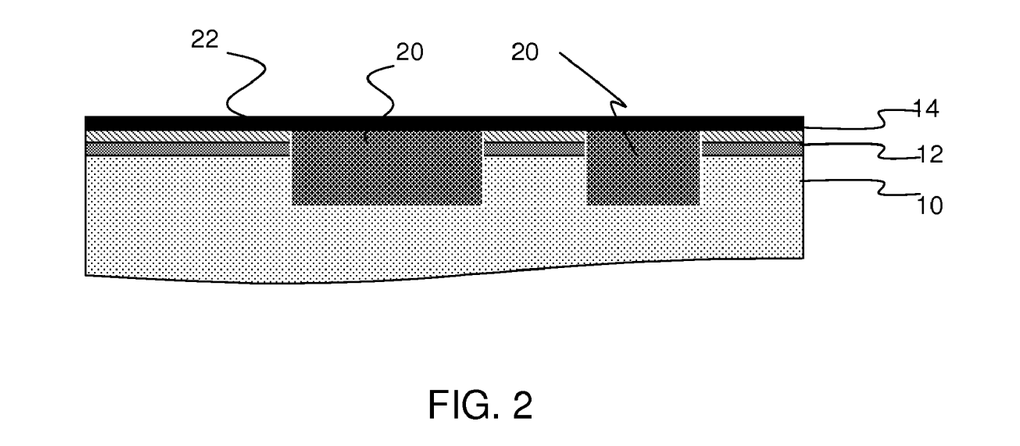
FIGS. 2-12 represent intermediate structures and respective processes for fabricating the structure in accordance with an aspect of the invention.

Referring to FIG. 2, in embodiments, the trenches 18 are filled with an oxide material to form shallow trench isolation (STI) structures 20. In embodiments, prior to the deposition of the oxide material, a thermal oxidation process may be performed to layer the sidewalls of the trenches 18 with oxide. The structure is then planarized using conventional processes such as, for example, chemical mechanical polishing (CMP) techniques. The planarization process will stop at the pad layer 14, which is used as a reference. A nitride cap 22 is then deposited over the structure. The nitride cap 22 has a thickness of about 50 Å to 1000 Å, with a preferable thickness of about 200 Å to 400 Å and a more preferable thickness of about 250 Å to 300 Å.

Figure 3:
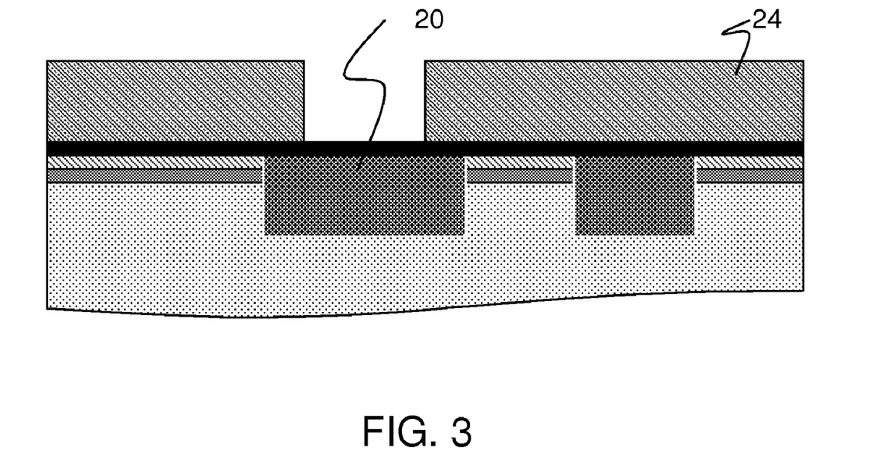

In FIG. 3, a photoresist material 24 is deposited on the structure of FIG. 2. The photoresist material 24 may be deposited using any conventional deposition process. The photoresist material 24 is aligned with the underlying STI 20.

Figure 4:
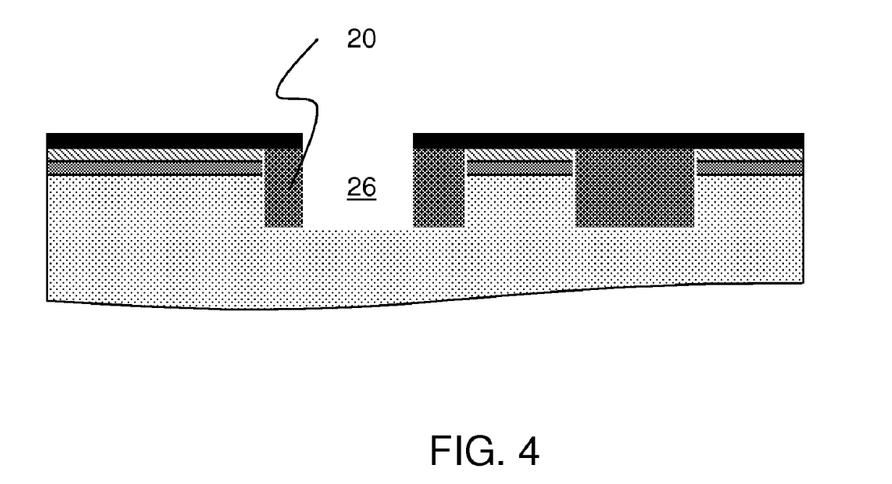
Figure 5:
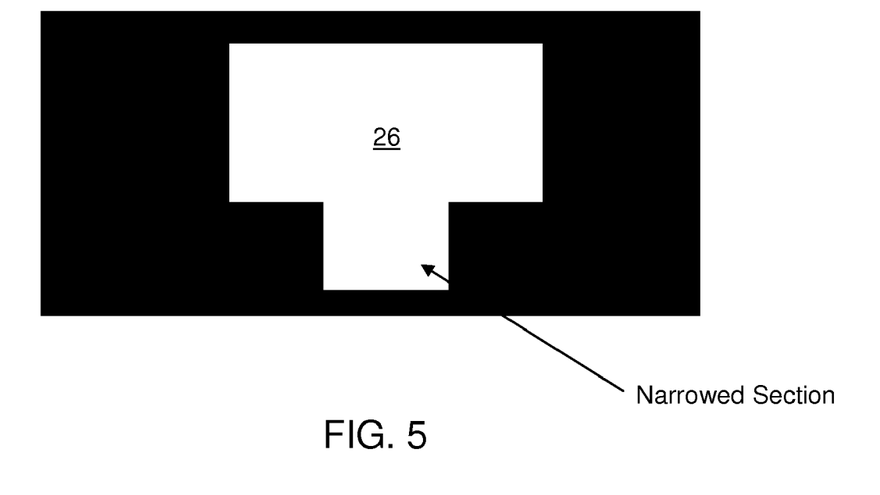

As shown in FIG. 4, a hole 26 is formed in the STI 20 using a conventional etching process. The photoresist material 24 is also removed. FIG. 5 shows a cross sectional view of the hole 26 formed in FIG. 4. As shown in FIG. 5, the shape of the hole 26 is a "T" shape, having a narrowed section. In embodiments, the narrowed section has a width of about 120 nm and preferably about 200 nm.

Figure 6:
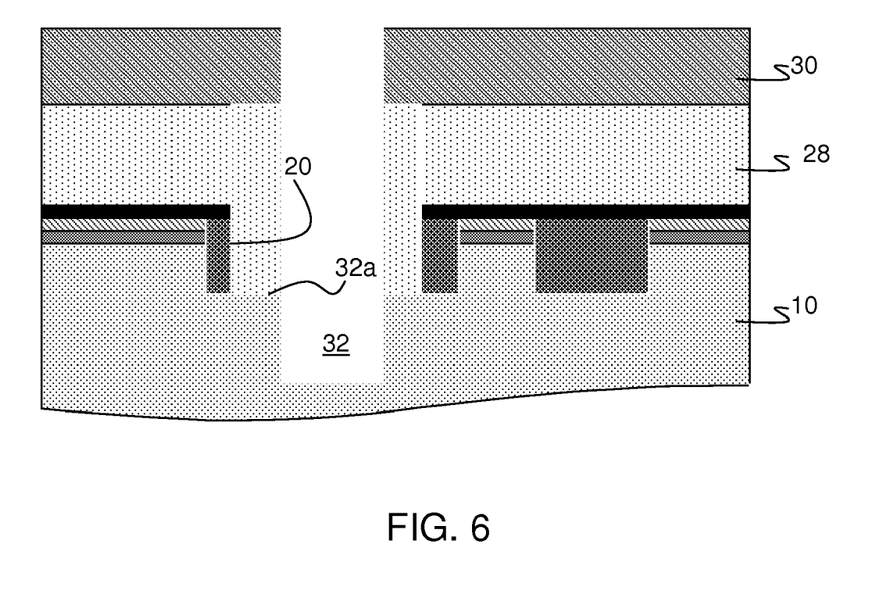

FIG. 6 shows the deposition of a BSG layer 28 and a resist layer 30 over the structure of FIG. 4. In embodiments, the BSG layer 28 is about 10,000 Å; although, it should be understood that the thickness of the BSG layer 28 can be adjusted based on the design of the device. In embodiments, a hole is opened into the resist layer 30 using a conventional lithographic process. The hole is substantially aligned with the STI 20. Using conventional etching processes, a hole 32 is patterned through the BSG layer 28 and into the substrate 10. A shoulder 32a is formed approximately near the junction of the STI 20 and the substrate 10. In embodiments, the hole 32 extends approximately 5 microns to 10 microns below the surface of the substrate 10.

Figure 7:
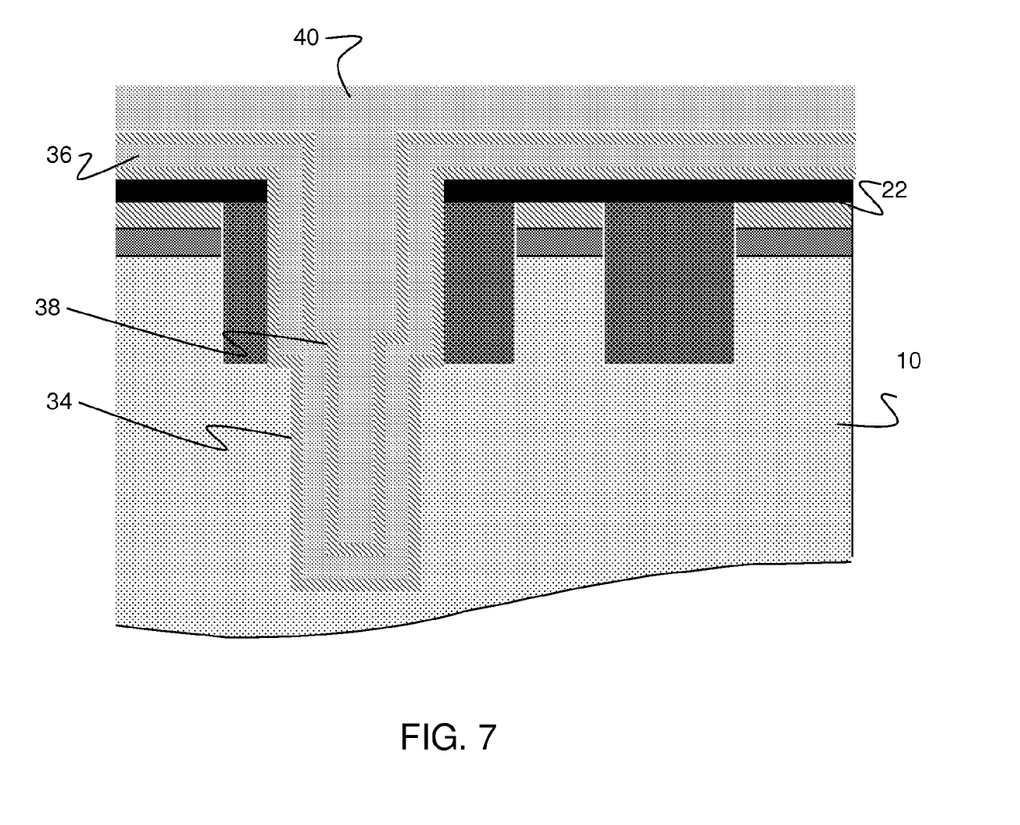

As shown in FIG. 7, the BSG layer 28 and the resist layer 30 are removed, using conventional processes. For example, in embodiments, the resist layer 30 may be removed during the etching process that formed the hole 32. The BSG layer 28 may be removed using a wet etching process, with the underlying nitride layer 22 acting as an etch stop layer.

Figure 8:
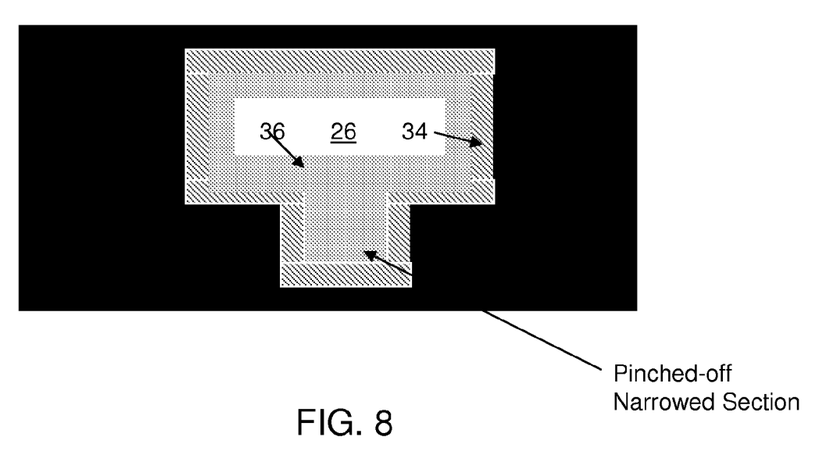

A series of layers 34, 36, 38, 40 are then deposited on the structure and preferably within the hole in a conventional manner. In particular, layer 34 is an oxide layer and more preferably an oxynitride layer. The oxynitride layer 34, in embodiments, acts as an insulator layer, insulating the substrate 10 from a poly layer 36. In embodiments, the layer 34 is about 20 nm. The layer 34 can be a thinner layer in order to provide a capacitance between the substrate 10 and the overlying poly layer 36. The poly layer 36 can be doped with arsenic and will act as a first electrode plate. The poly layer 36 can be about 100 nm and, as shown in FIG. 8, will effectively pinch off the narrowed section of the hole. The adjustment of the deposition of the layer 36 to the width of the narrow section shown in FIG. 8 provides many advantages to the present invention.

Still referring to FIG. 7, a second oxynitride layer 38 is deposited over the poly layer 36. The second oxynitride layer 38 will act as a capacitor. The oxynitide layer 38 is about 7 nm and may range from about 3 to 10 nm. A second poly layer 40 is deposited over the oxynitride layer 38. The second poly layer 40 is doped with arsenic and will act as an electrode plate to the capacitor. The second poly layer 40 is about 200 nm. In embodiments, a capacitance will be generated between the two poly layers 36, 40.

In further embodiments, the layers 36 and 40 can be a poly, metal or metal silicide or any other electrical conductor. In any scenario, these layers will form electrode plates for the capacitor. Also, in embodiments, the layer 40 will be exposed on the upper surface of the structure to form a contact region. The lower plate will be an independent electrode, isolated from the wafer body (i.e., substrate). In this manner, electron hole pairs created by, for example, radiation or other unwanted charging events, will not be swept to the first electrode as it is isolated from the wafer body. As such, the electrons hitting the wafer body will not disrupt the capacitor.

Figure 9:
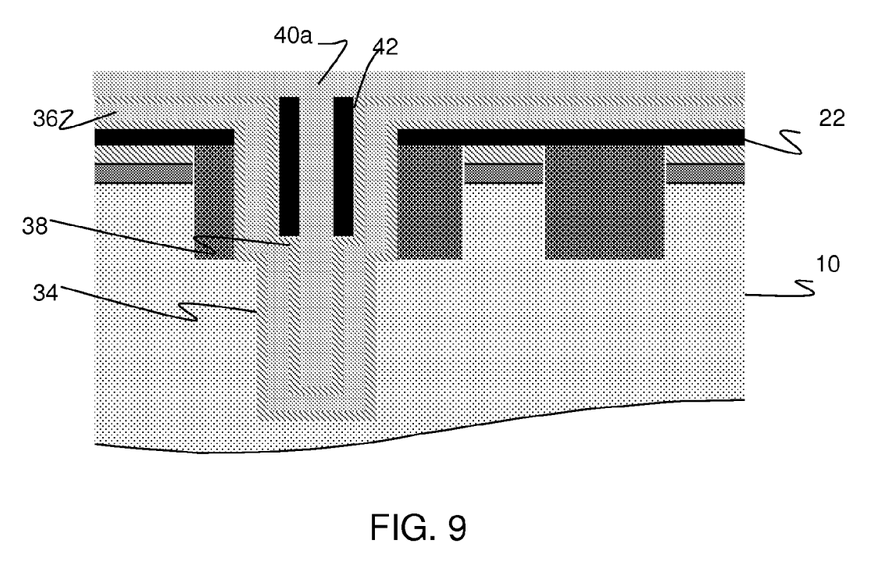

In FIG. 9, as an optional embodiment, the top layer 40 is etched back using conventional etching processes, which results in a hole. The hole is then filled with a dielectric material such as, for example, oxide. The oxide is then etched back using a conventional directional etching process to form sidewall spacers 42. The sidewall spacers 42 will add a margin to effectively eliminate any potential shorts. The open spaced between the sidewall spacers 42 is then filled with additional poly material 40a.

Figure 10:
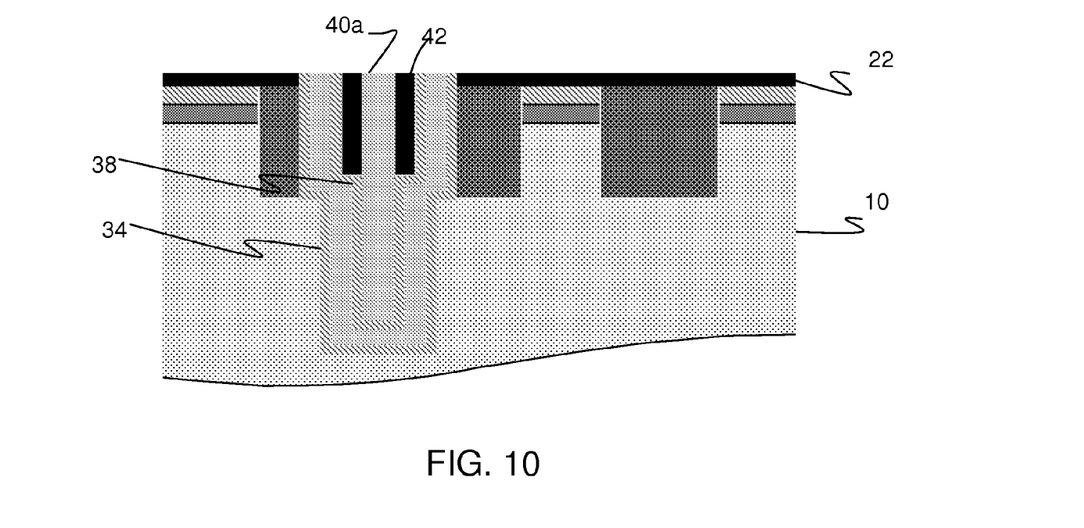
Figure 11:
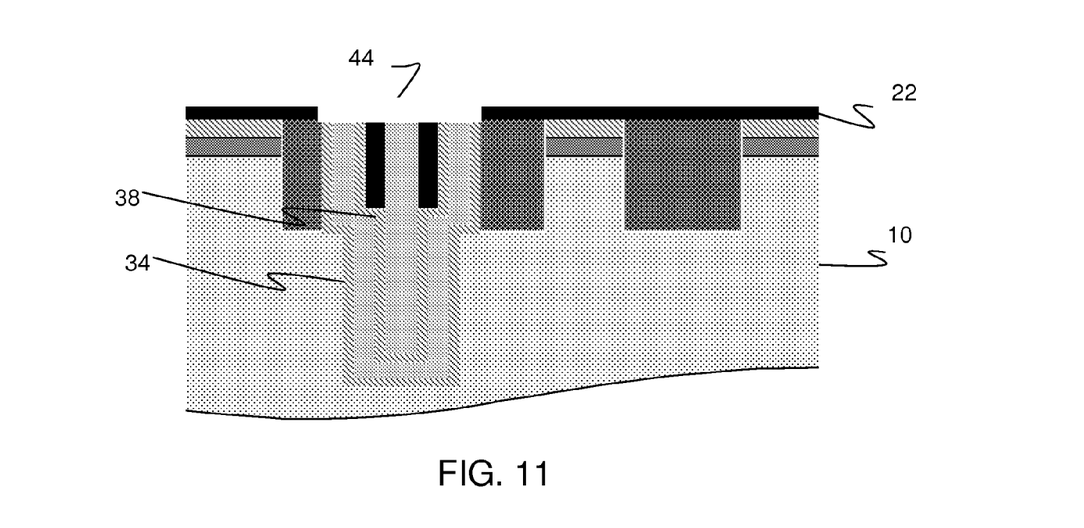

In FIG. 10, the layers 38 and 40 deposited on the nitride layer 22 are etched or polished (e.g., CMP) away using a conventional etching or polishing process. The pad nitride layer 22 acts as an etch or polish stop for this process. In FIG. 11, the layers 34, 36, 38 and 40 are etched back to form a recess 44 within the STI 20, to about half of the depth of the STI 20. In embodiments, a deglaze process using HFEG will remove the oxynitride layers 34 and 38.

Figure 12:
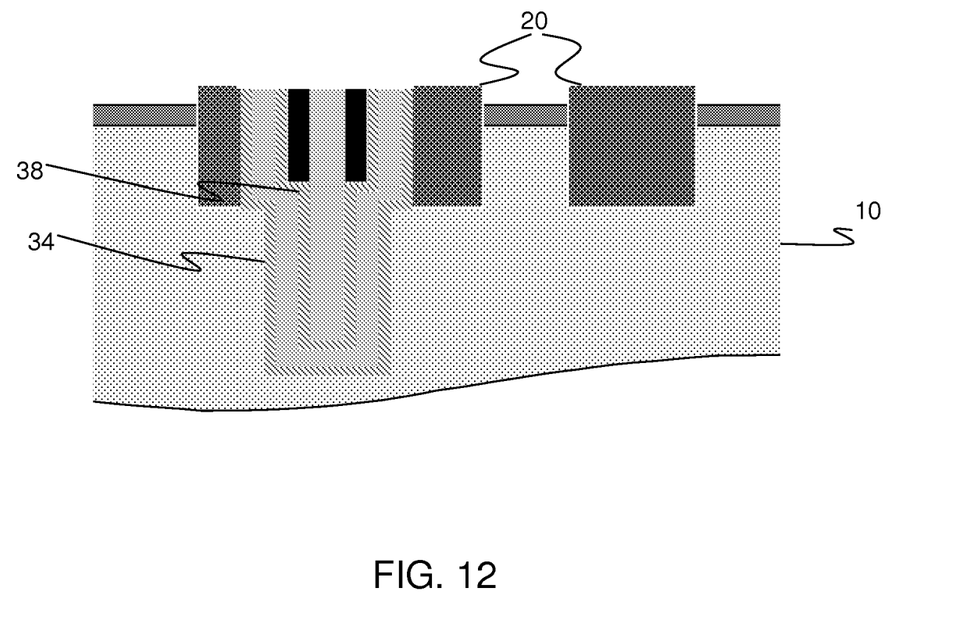

In FIG. 12, the nitride layer 22 is removed using a hot phosphoric removal process. Also, the layers 12 and 14 are removed using an HF process. The HF process will pull down the STI oxide fill, but will only slightly impact the oxynitride layers 34, 38. In embodiments, a metal material may be formed over selective portions of the poly material 36, 40 to form metal contacts.

Figure 13:
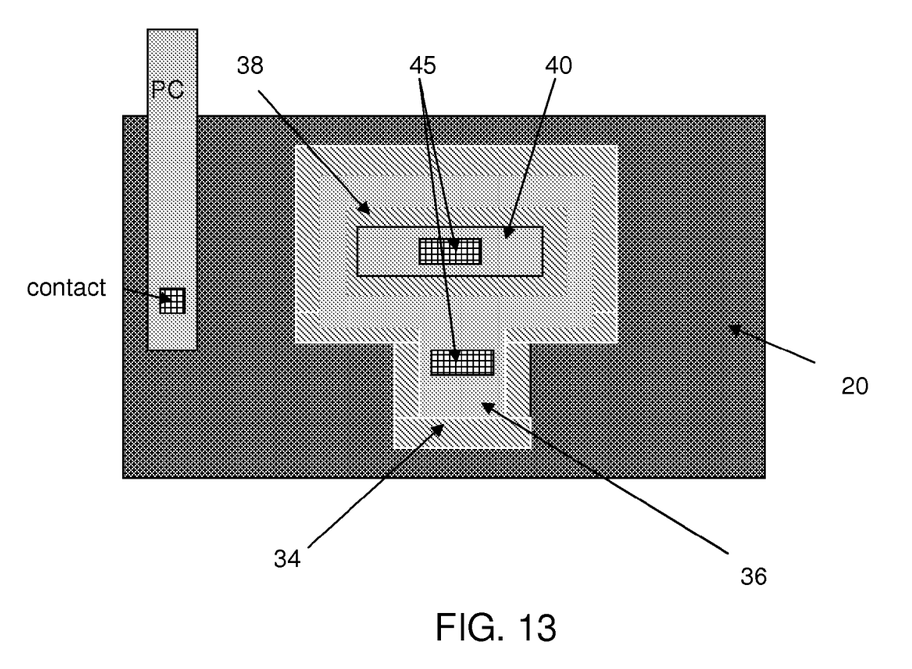
FIG. 13 represents a final structure and respective processes for fabricating the structure in accordance with the invention.

FIG. 13 shows a top sectional view of FIG. 12 with metal contacts 45. In embodiments, the contact to the first poly layer 36 may not be landed. In further embodiments, the following dimensions of the structures are contemplated, although the technology may continue to be scaled in accordance with aspects of the invention.

| Description | Size (um) |
| --- | --- |
| dimensions of poly layer 36 (L = W) | =0.40 |
| Length of hole (26) | >=0.85 |
| Width of narrowed portion (high) | =0.64 |

| Description | Size (um) |
|---|---|
| Width of narrowed portion (low) | =0.21 |
| Poly layer (40) within hole (26) | >=0.12 |
| Distance between poly layer (40) to PC layer (40) adjacent to contact (44) | >=0.10 >=0.13 |
| Contact (44) within poly layer (40) | =0.14 |
| Contact (44) within narrow portion of poly layer (36) (narrow portion) | =0.045 |
| Contact (44) within narrow portion of poly layer (36) (narrow portion) | >=0.08 |

Figure 14:
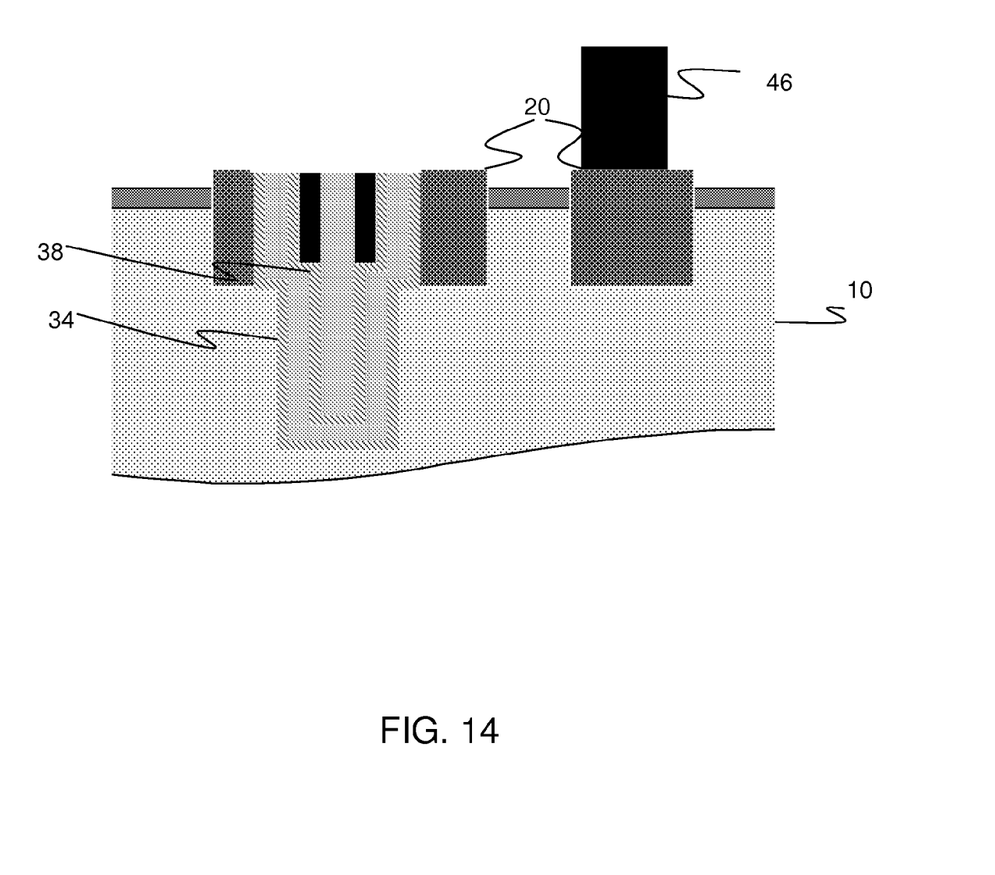
FIG. 14 represents an alternative final structure and respective processes for fabricating the structure in accordance with the invention.

FIG. 14 shows standard processing through the formation of a gate oxide structure. For example, a poly conductor material is deposited over the structure of FIG. 12 using a conformal deposition process. A resist is selectively formed over the poly conductor material. Through a conventional etching process a vertical gate structure 46 is formed from the poly conductor material. Additionally processes such as, for example, gate sidewalls and spacers can also be formed using conventional processes.

Design Structure

Figure 15:
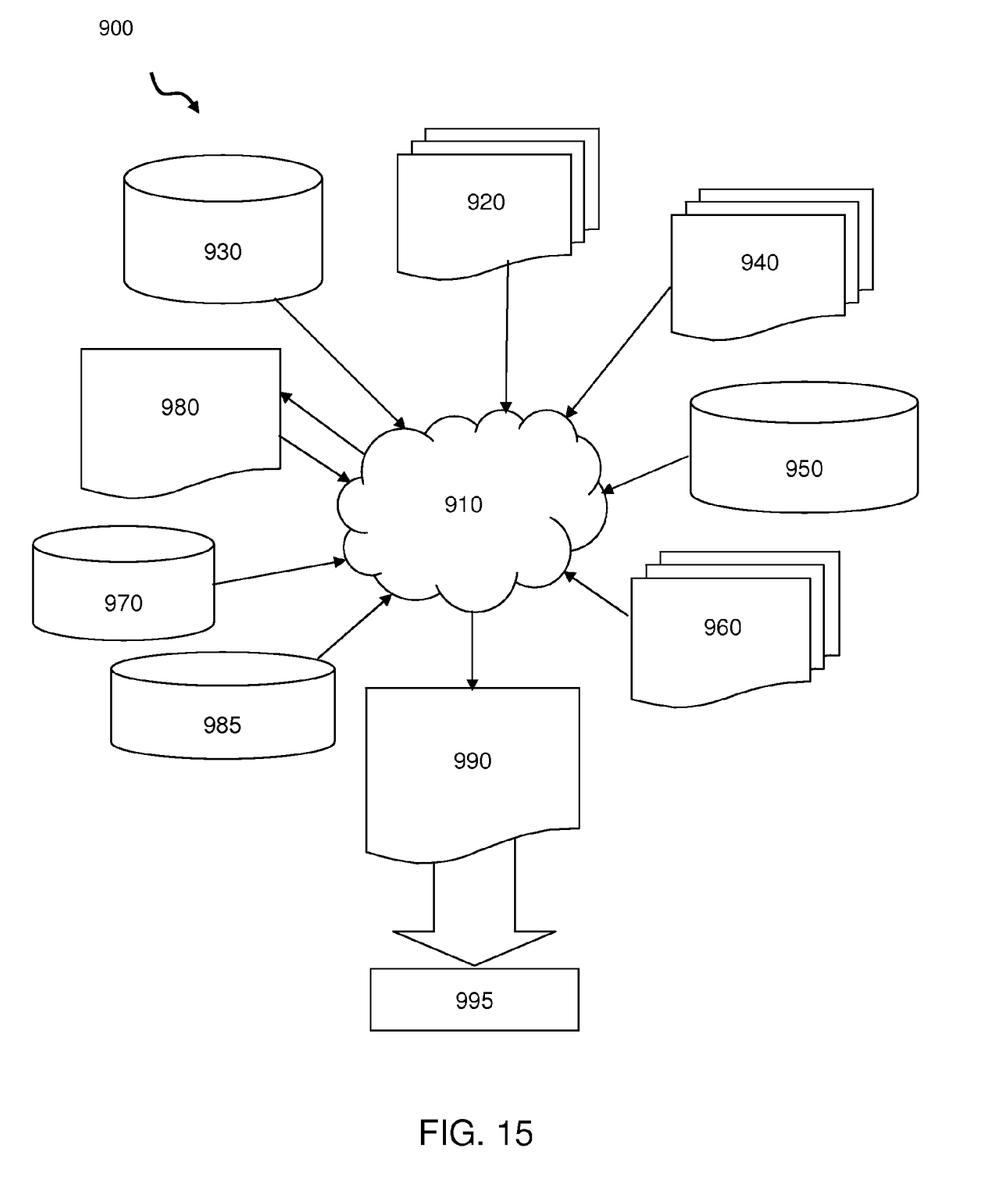
FIG. 15 is a flow diagram of a design process used in semiconductor design, manufacture, and/or test.

FIG. 15 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 13 and 14 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 13 and 14. Design process 910 preferably synthesizes (or translates) an embodiment of the invention as shown in FIGS. 13 and 14 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 13 and 14, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GLI, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 13 and 14. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A structure comprising:
    a shallow trench isolation (STI) structure formed in a wafer body;
    a first hole formed in the STI structure to a first depth, and having a cross-sectional size;
    a second hole aligned with the STI structure and formed into the wafer body to a second depth greater than the first depth, and having a different cross-sectional size less than the cross-sectional size;

a first plate formed within the first hole and the second hole, and being isolated from the wafer body by a first insulator layer formed in the first hole and the second hole; and a second plate formed within the first hole and the second hole, and being isolated from the wafer body and the first plate by a second insulator layer formed in the first hole and the second hole, and top surfaces of the STI structure, the first plate, the first insulator layer, the second plate, and the second insulator layer being at a same level.

2. The structure of claim 1, wherein the first plate and the second plate are independent from each other.

3. The structure of claim 1, wherein the first plate and the second plate are one of polysilicon, metal and metal silicide.

4. The structure of claim 1, wherein the first plate and the second plate are connected to contacts.

5. The structure of claim 1, further comprising an isolation structure between the second plate and the second insulator.

6. The structure of claim 1, wherein the second hole extends into an underlying substrate.

7. The structure of claim 1, wherein the first plate pinches off a portion of the first hole such that the second plate is not within the pinched off portion.

8. The structure of claim 1, wherein the first plate and the second plate are recessed within the first hole and the second hole and surrounded, at least partially, by the STI structure.

9. The structure of claim 1, further comprising at least two STI structures, wherein the first hole is formed in one of the STI structures.

10. The structure of claim 9, wherein the STI structures protrude above a surface of a substrate and the second hole extends into the substrate.

11. The structure of claim 1, wherein the first hole and the second hole are scalable to increase or decrease a surface area of the first plate and the second plate thereby increasing or decreasing, respectively, a capacitance target of the structure.

12. The structure of claim 1, further comprising a silicon dioxide layer formed on the wafer body, the first hole formed through the silicon dioxide layer, and the top surfaces of the first plate, the first insulator, the second plate, and the second insulator layer being at the same level as the top surface of the STI structure.

13. The structure of claim 12, wherein:
a shape of the first hole is a T shape comprising a narrowed section;
the first plate pinches off the narrowed section of the first hole such that the second plate is only in another section of the first hole; and
the first plate and the second plate are formed within the first hole and the second hole such that a shoulder is formed approximately at a junction of the STI structure and the wafer body.

14. The structure of claim 1, further comprising a first sidewall spacer formed between and in physical contact with the second insulator layer and the second plate.

15. The structure of claim 14, further comprising a second sidewall spacer formed between and in physical contact with the second insulator layer and the second plate, the second sidewall spacer being isolated from the first sidewall spacer by the second plate.

16. The structure of claim 15, further comprising:
another STI structure formed in the wafer body and adjacent to the STI structure; and
a vertical gate structure formed on and in physical contact with the another STI structure.

17. A structure comprising:
a shallow trench isolation (STI) structure formed in a wafer body;
a first hole formed in the STI structure;
a second hole formed through the STI structure and extending into the wafer body, the first hole and the second hole comprising a stepped transitional feature within the wafer body;
a first plate formed within the first hole and the second hole, and being isolated from the wafer body; and
a second plate formed within the first hole and the second hole, being independent of the first plate, and being isolated from the first plate, top surfaces of the STI structure, the first plate, and the second plate being at a same level, and the first plate and the second plate being formed on the stepped transitional feature.

18. The structure of claim 17, further comprising an insulating material between the first plate from the wafer body.

19. The structure of claim 18, further comprising:
a silicon dioxide layer formed on the wafer body; and
another insulating material between the first plate and the second plate, the first hole formed through the silicon dioxide layer, and the top surfaces of the STI structure, the first plate, and the second plate being at the same level as top surfaces of the insulating material and the another insulating material.

20. The structure of claim 19, wherein:
a shape of the first hole is a T shape comprising a narrowed section;
the first plate pinches off the narrowed section of the first hole such that the second plate is only in another section of the first hole; and
the first plate and the second plate are formed within the first hole and the second hole such that a shoulder is formed approximately at a junction of the STI structure and the wafer body.

21. The structure of claim 17, further comprising contacts on exposed regions of the first plate and the second plate.

22. The structure of claim 17, wherein the first plate and the second plate comprise a poly material, metal or metal silicide.

23. The structure of claim 17, wherein the first plate includes a poly material in the first hole which pinches off a portion of the first hole such that the second plate is only in another portion of the first hole.

* * * * *